(12) United States Patent
Smith, Jr.

(10) Patent No.: US 7,729,667 B2
(45) Date of Patent: Jun. 1, 2010

(54) SYSTEM AND METHOD FOR INTERMODULATION DISTORTION CANCELLATION

(75) Inventor: Marlin C. Smith, Jr., Cypress, CA (US)

(73) Assignee: Raytheon Company, Waltham, MA (US)

( * ) Notice: Subject to any disclaimer, the term of this patent is extended or adjusted under 35 U.S.C. 154(b) by 916 days.

(21) Appl. No.: 11/355,842

(22) Filed: Feb. 16, 2006

(65) Prior Publication Data

US 2007/0190946 A1 Aug. 16, 2007

(51) Int. Cl.
*H04B 1/04* (2006.01)
*H03F 3/04* (2006.01)

(52) U.S. Cl. ............ 455/114.2; 455/114.3; 455/239.1; 330/296; 330/287

(58) Field of Classification Search ............ 455/114.2, 455/114.3, 115.1, 239.1, 286, 287; 330/286, 330/287, 296, 176, 192
See application file for complete search history.

(56) References Cited

U.S. PATENT DOCUMENTS

| | | | | |
|---|---|---|---|---|
| 3,763,380 A * | 10/1973 | Homer et al. | ............ | 327/37 |
| 4,152,733 A * | 5/1979 | Melwisch | ............ | 360/65 |
| 4,682,346 A * | 7/1987 | Faith et al. | ............ | 379/22 |
| 5,138,275 A * | 8/1992 | Abbiati et al. | ............ | 330/149 |
| 5,204,637 A * | 4/1993 | Trinh | ............ | 330/129 |
| 5,278,996 A * | 1/1994 | Shitara | ............ | 455/127.1 |
| 5,523,716 A * | 6/1996 | Grebliunas et al. | ............ | 330/149 |
| 5,673,001 A * | 9/1997 | Kim et al. | ............ | 330/284 |
| 6,281,748 B1 * | 8/2001 | Klomsdorf et al. | ............ | 330/129 |
| 6,307,436 B1 * | 10/2001 | Hau | ............ | 330/149 |
| 6,333,677 B1 * | 12/2001 | Dening | ............ | 330/296 |
| 6,486,739 B1 * | 11/2002 | Luo | ............ | 330/288 |
| 6,864,742 B2 * | 3/2005 | Kobayashi | ............ | 330/124 R |
| 6,973,288 B1 * | 12/2005 | Davis et al. | ............ | 455/67.11 |
| 7,345,547 B2 * | 3/2008 | Wang et al. | ............ | 330/285 |
| 7,348,843 B1 * | 3/2008 | Qiu et al. | ............ | 330/149 |
| 7,420,416 B2 * | 9/2008 | Persson et al. | ............ | 330/149 |
| 7,557,654 B2 * | 7/2009 | Noto et al. | ............ | 330/149 |
| 2001/0040483 A1 * | 11/2001 | Dening et al. | ............ | 330/296 |
| 2005/0140439 A1 * | 6/2005 | Hyoung et al. | ............ | 330/149 |
| 2009/0174475 A1 * | 7/2009 | Yuen et al. | ............ | 330/133 |

* cited by examiner

*Primary Examiner*—Duc M Nguyen
(74) *Attorney, Agent, or Firm*—Christie, Parker & Hale, LLP

(57) ABSTRACT

A linearizer for reducing intermodulation distortion in a nonlinear device. The novel linearizer includes an input port for receiving a signal from the device and a circuit for effecting gain expansion on the signal that counteracts a gain compression of the device. In an illustrative embodiment, the circuit includes a starved limiter in shunt with the device, implemented using a pair of biased diodes D1 and D2. The first diode D1 is connected to ground and the second diode D2 is coupled to the signal. In an alternate embodiment, the linearizer also includes a second pair of biased diodes D3 and D4, D3 connected to ground and D4 coupled to the signal, and a plurality of reactive elements for increasing the operational bandwidth of the linearizer.

33 Claims, 5 Drawing Sheets

SYSTEM AND METHOD FOR INTERMODULATION DISTORTION CANCELLATION

BACKGROUND OF THE INVENTION

1. Field of the Invention

The present invention relates to electrical and electronic circuits and systems. More specifically, the present invention relates to systems and methods for reducing intermodulation distortion.

2. Description of the Related Art

Intermodulation distortion is a major problem in many electronic circuits, particularly for radar receivers. Receivers typically include several non-linear components, such as amplifiers and mixers, which produce intermodulation distortion whenever more than one frequency is present in the input signal. The greater the non-linearity of the device, the higher the intermodulation created. This effect is usually measured by the third order intercept point (IP3) of the device.

Distortion can be reduced by using higher linearity components such as high power amplifiers, but greater linearity typically requires larger devices, higher power, and greater cost. An alternative solution for reducing intermodulation distortion is to employ distortion cancellation techniques such as feedforward cancellation or predistortion modulation. These approaches, however, typically require large, complex circuitry and can often add to the noise figure of the system.

Hence, a need exists in the art for an improved system or method for reducing intermodulation distortion that offers better performance and less complexity than prior art approaches.

SUMMARY OF THE INVENTION

The need in the art is addressed by the system and method for reducing intermodulation distortion in a non-linear device of the present invention. The novel system includes a linearizer having an input port for receiving a signal from the device and a circuit for effecting gain expansion on the signal that counteracts the gain compression of the device. In an illustrative embodiment, the circuit includes a starved limiter in shunt with the device, implemented using a pair of biased diodes D1 and D2. The first diode D1 is connected to ground and the second diode D2 is coupled to the signal. In an alternate embodiment, the linearizer also includes a second pair of biased diodes D3 and D4, D3 connected to ground and D4 coupled to the signal, and a plurality of reactive elements for increasing the operational bandwidth of the linearizer.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Intermodulation distortion is generated due to the non-linearity of a device. Non-linear devices such as amplifiers typically have gain compression characteristics, where larger input signal levels have a decreased gain than smaller signal levels. In accordance with the teachings of the present invention, intermodulation distortion can be reduced by adding a linearizer circuit that provides instantaneous gain expansion to counteract the small-signal gain compression of the device. That is, the circuit provides an increase in gain vs. signal level to compensate for the decrease in gain vs. level that the system device generates.

The novel linearizer of the present invention provides this function on instantaneous voltage levels, as per the system devices generating the distortion. The circuit accomplishes this by creating a level-dependent load. The loss due to this load decreases as signal level increases. The circuit makes use of a starved limiter in shunt with the device causing the distortion. The limiter shunts signal to ground, creating loss. However, the limiter is starved for current, so as the signal level increases, the signal current shunted to ground becomes limited, and results in less loading and less loss on the device. By proper selection of limit level and impedances, the loss-compression of the linearizer can be made to equal the gain-compression of the input device, resulting in better total linearity and decreased third order intermodulation distortion.

Figure 1:
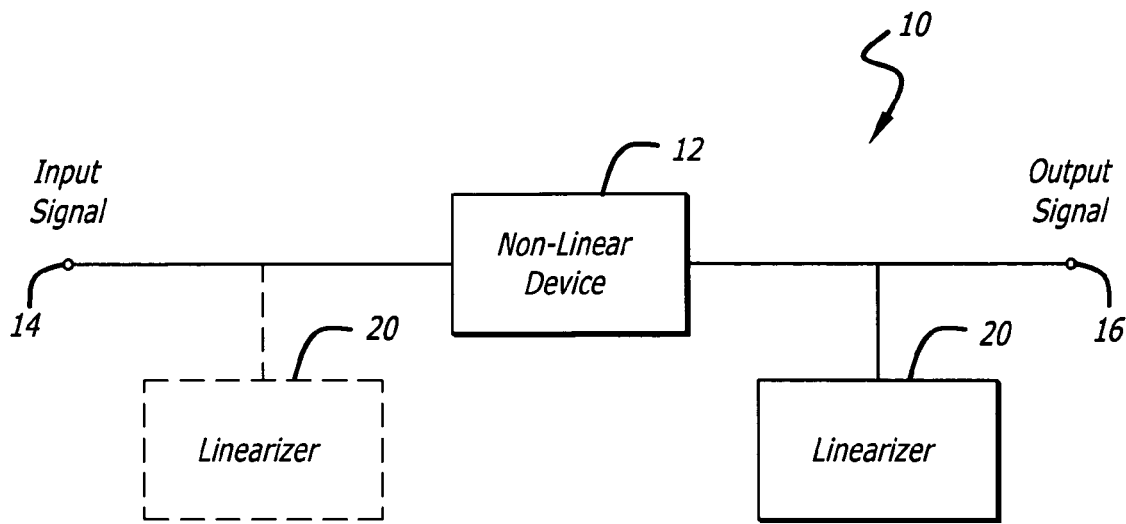
FIG. 1 is a simplified block diagram of a system using a linearizer designed in accordance with an illustrative embodiment of the present invention.

FIG. 1 is a simplified block diagram of a system 10 using a linearizer 20 designed in accordance with an illustrative embodiment of the present invention. The system 10 includes a non-linear device 12 having an input terminal 14 and an output terminal 16. A linearizer 20 is coupled in shunt with the signal path at the output 16 of the device 12. Alternatively, the linearizer 20 may be coupled to the input 14 of the device 12, as shown by the dotted lines in FIG. 1. The non-linear device may be a simple device, such as an amplifier, or it may be a more complex device such as a receiver, which includes a cascade of several non-linear components (such as amplifiers and mixers), each of which contribute to the overall gain compression of the device. In this case, a single linearizer can be used to compensate for the overall gain compression of the system.

Figure 2:
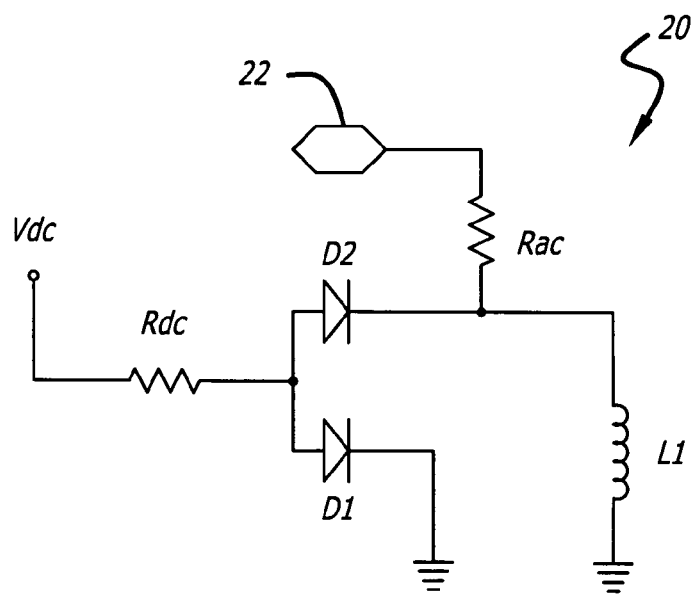
FIG. 2 is a simplified schematic diagram of a linearizer designed in accordance with an illustrative embodiment of the present invention.

FIG. 2 is a simplified schematic diagram of a linearizer 20 designed in accordance with an illustrative embodiment of the present invention. The linearizer 20 includes a pair of biased diodes D1 and D2 configured like a starved limiter circuit, in shunt with the signal path to provide a load that decreases with increasing signal levels. The anodes of D1 and D2 are connected together and coupled to a bias voltage Vdc through a resistor Rdc. The cathode of the first diode D1 is connected to ground, and the cathode of the second diode D2 is coupled to the signal at an input port 22. A resistor Rac is connected between the cathode of D2 and the input port 22. The cathode of D2 is also coupled to ground by an inductor L1. Alternately, the diodes D1 and D2 can be reversed, with the cathodes connected together, if a negative bias voltage Vdc is utilized instead of a positive voltage.

The resistors Rdc and Rac together set the biasing conditions. With the proper choice of biasing conditions, the gain expansion should match the gain compression of the signal input, thereby increasing linearity and improving IP3.

Figure 3:
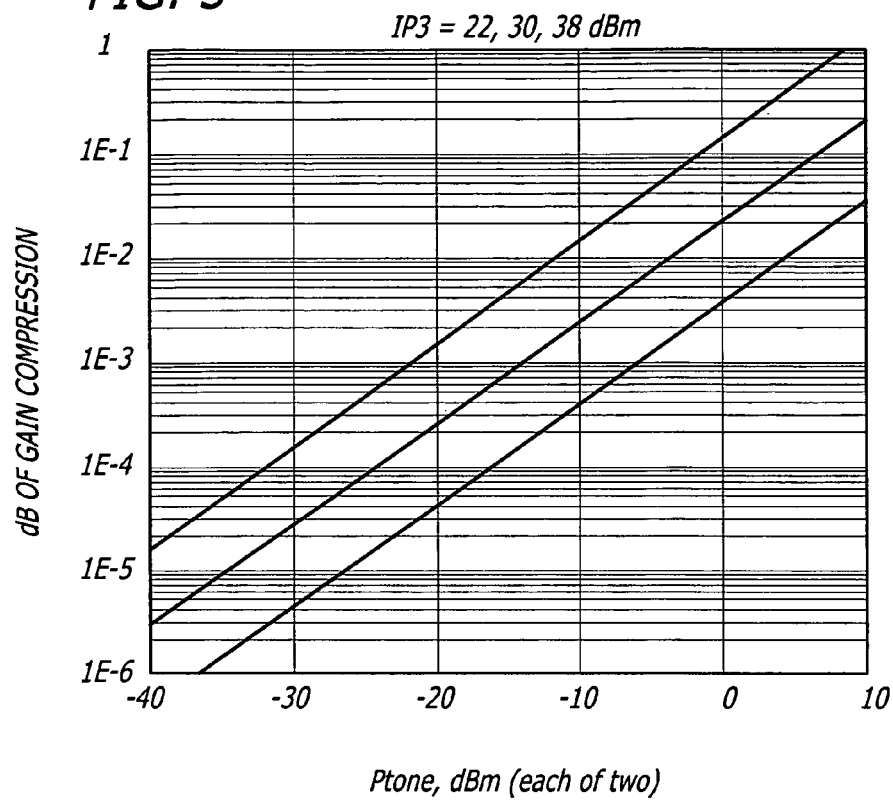
FIG. 3 is a graph of gain compression vs. signal level of an illustrative amplifier having third order intercepts points (IP3) of 22 dBm, 30 dBm, and 38 dBm.
Figure 4:
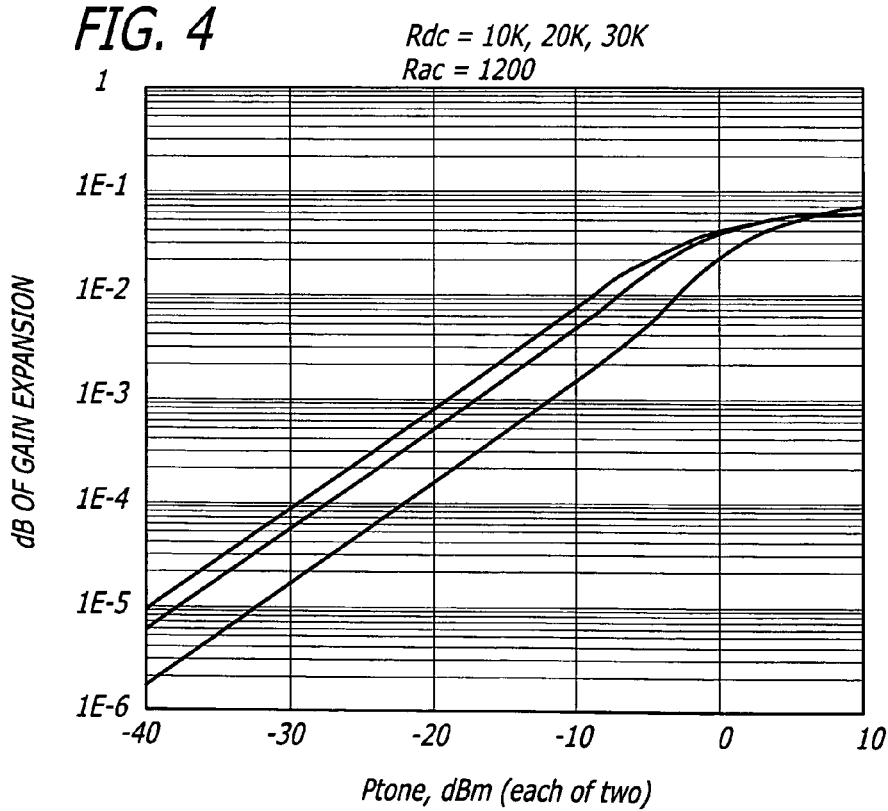
FIG. 4 is a graph of gain expansion vs. signal level of an illustrative linearizer circuit designed in accordance with the present teachings.

FIG. 3 is a graph of gain compression vs. signal level of an illustrative amplifier having third order intercepts points (IP3) of 22 dBm, 30 dBm, and 38 dBm. FIG. 4 is a graph of gain expansion vs. signal level of an illustrative linearizer circuit designed in accordance with the present teachings. The curves shown in FIG. 4 are for three exemplary biasing currents, with Rdc values of 10 kΩ, 20 kΩ, and 30 kΩ (for Rac=1200Ω and Vdc=+5 V). At low signal levels, the gain expansion follows the same slope as the gain compression of the amplifier shown in FIG. 3. With proper bias adjustment, the expansion should cancel the compression and provide better linearity, improving the IP3.

Figure 5:
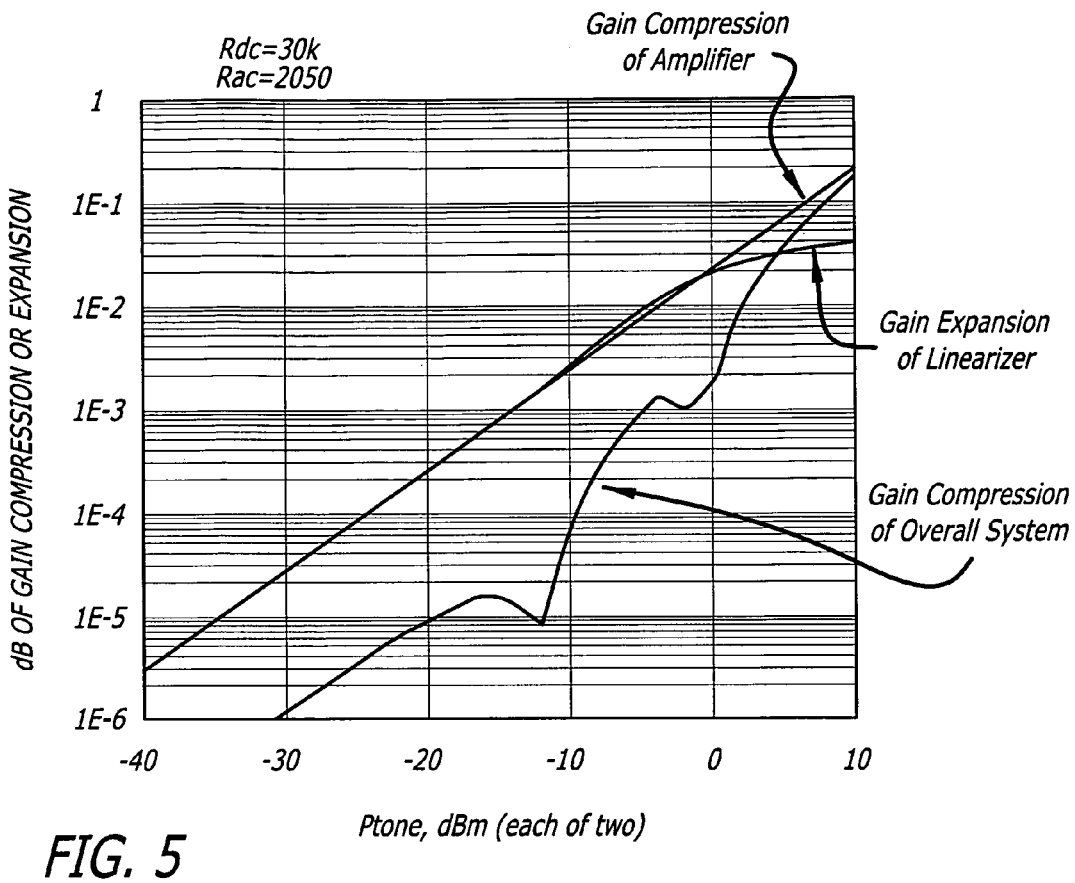
FIG. 5 is a graph showing the gain compression of an input signal by an illustrative amplifier, the gain expansion of an illustrative linearizer circuit designed in accordance with the present teachings, and the overall results obtained with proper biasing of the circuit.

FIG. 5 is a graph showing the gain compression of an input signal by an illustrative amplifier, the gain expansion of an illustrative linearizer circuit designed in accordance with the present teachings, and the overall results obtained with proper biasing of the circuit. (In this example, the linearizer is biased with Rdc=30 kΩ, Rac=2050Ω, and Vdc=+5 V.) The reduced compression of the overall system with the linearizer indicates greatly improved linearity and a much higher IP3.

Figure 6:
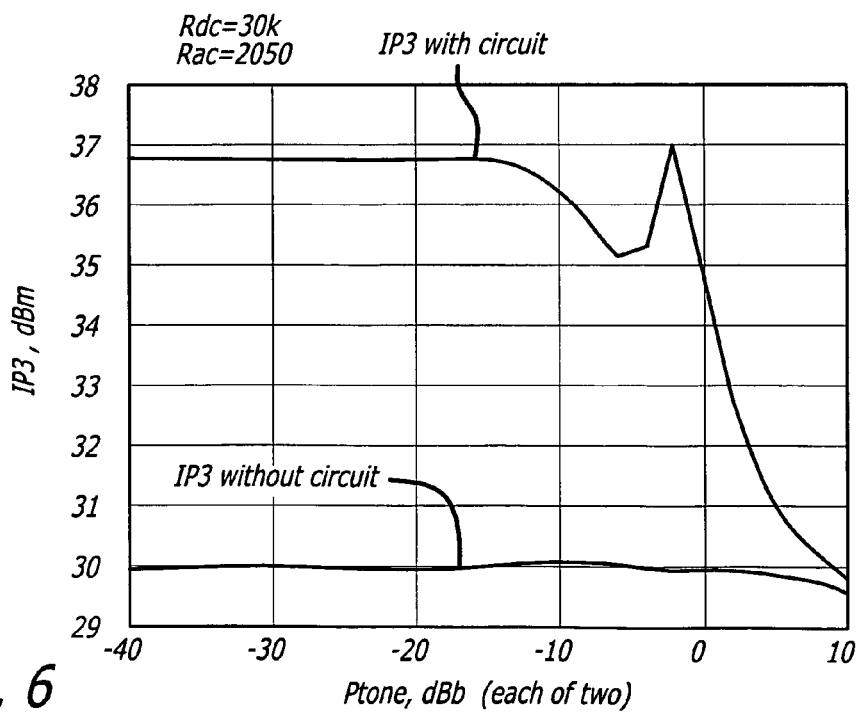
FIG. 6 is a graph showing the third order intercept point (IP3) of the illustrative amplifier with and without the illustrative linearizer circuit, showing an improvement of about 7 dBm.

FIG. 6 is a graph showing the third order intercept point (IP3) of the illustrative amplifier with and without the illustrative linearizer circuit, showing an improvement of about 7 dBm.

Figure 7:
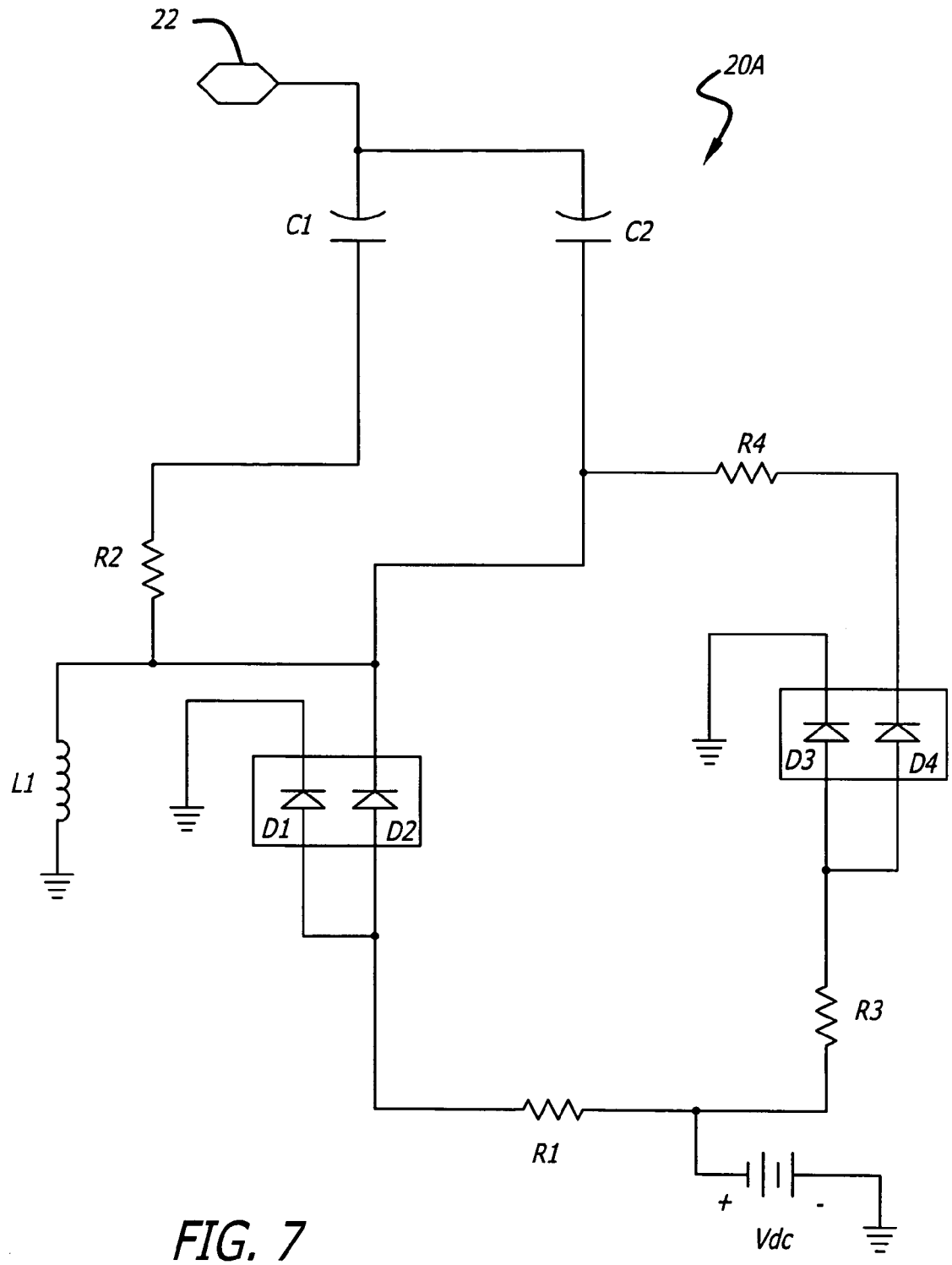
FIG. 7 is a simplified schematic diagram of another illustrative embodiment of a linearizer designed in accordance with the teachings of the present invention.

FIG. 7 is a simplified schematic diagram of another illustrative embodiment of a linearizer 20A designed in accordance with the teachings of the present invention. This embodiment includes two pairs of shunt diodes to help maintain the same anti-intercept point at higher signal levels, and a plurality of reactive elements (capacitors and inductors) to increase the bandwidth of the circuit. The linearizer 20A includes a first diode pair D1 and D2, and a second diode pair D3 and D4. The anodes of D1 and D2 are connected together and coupled to a bias voltage Vdc through a resistor R1. The cathode of the first diode D1 is connected to ground, and the cathode of the second diode D2 is coupled to the signal at an input port 22. A resistor R2 is connected in series with a capacitor C1 between the cathode of D2 and the input port 22. The cathode of D2 is also coupled to ground by an inductor L1. Similarly, the anodes of D3 and D4 are connected together and coupled to the bias voltage Vdc through a resistor R3. The cathode of D3 is connected to ground, and the cathode of D4 is coupled to the cathode of D2 by a resistor R4. A resistor R2 is connected in series with a capacitor C1 between the cathode of D2 and the input port 22. A second capacitor C2 is connected between the cathode of D2 and the input port 22.

The embodiment shown in FIG. 7 offers lower impedance, making the circuit less susceptible to phase and amplitude variations vs. frequency. The anti-IP3 points produced by the circuit can be adjusted by adjusting the bias voltage Vdc. Two simultaneous bias conditions help to tune the linearizer circuit. Example biasing values for a linearizer optimized for operation at 56-96 MHz are: R1=4300Ω, R2=220Ω, R3=820Ω, R4=15Ω, C1=1000 pF, C2=2.2 pF, L1=4.7 μH, and Vdc=2 to 5 V.

In a preferred embodiment, the diode pairs (D1, D2) and (D3, D4) are implemented using high frequency diodes, such as balanced pairs of Schottky diodes.

Figure 8:
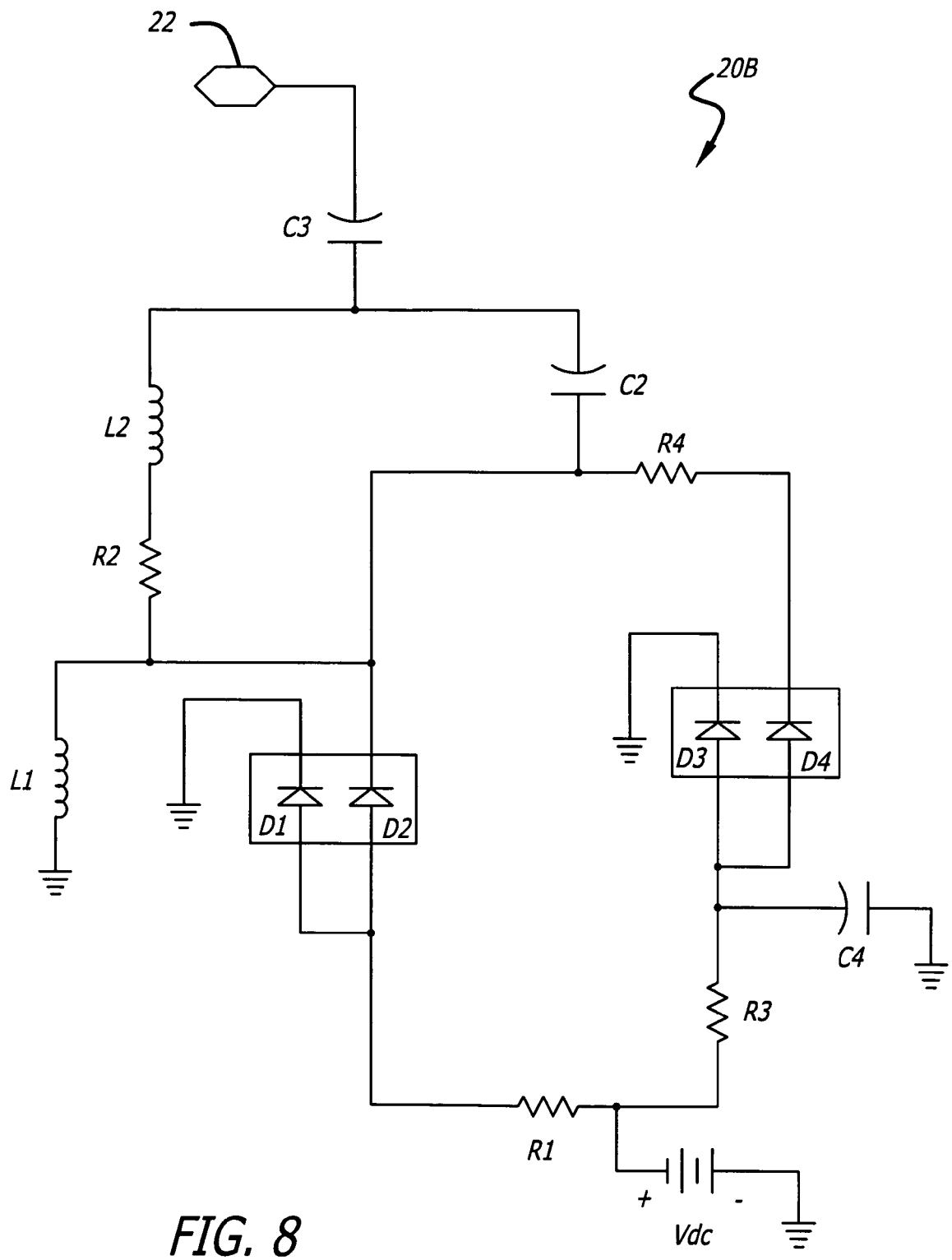
FIG. 8 is a simplified schematic diagram of another illustrative embodiment of a linearizer designed in accordance with the teachings of the present invention.

FIG. 8 is a simplified schematic diagram of another illustrative embodiment of a linearizer 20B designed in accordance with the teachings of the present invention. This embodiment includes small modifications to the circuit of FIG. 7 that should allow operation over wider frequency ranges. The circuit 20B is identical to that of FIG. 7 except the capacitor C1 is replaced with an inductor L2; a capacitor C3 is added between the input port 22 and the rest of the circuit (one end of the capacitor C3 is connected to the input port 22 and other end of the capacitor C3 is connected to the inductor L2 and the capacitor C2); and a shunt capacitor C4 (coupled to ground) is added to the common anodes of D3 and D4.

Exemplary biasing values for a linearizer optimized for operation at 120-450 MHz are: R1=3900Ω, R2=160Ω, R3=680Ω, R4=20Ω, C2=2.7 pF, C3=36 pF, C4=41.4 pF, L1=4.7 μH, L2=22 nH, and Vdc=2 to 5 V.

Thus, a linearizer has been disclosed in accordance with the present teachings which provides gain expansion to match a gain compression of an input signal, thereby increasing linearity and improving IP3. With proper biasing, excellent intermodulation distortion cancellation should be achievable over wide frequency ranges and signal levels. Inasmuch as the linearizer described herein is a very simple circuit with no amplifying devices (only diodes, resistors, capacitors, and inductors), the system noise figure should not be degraded by the addition of the linearizer circuit.

The linearizer can be placed either before the device that requires improvement (predistortion) or after the device that requires improvement (postdistortion) without departing from the scope of the present teachings.

Many systems extend dynamic range by use of programmable attenuators. This causes the system intermodulation distortions to vary with attenuation setting. By placing a linearizer before and after the programmable attenuators, the system performance can be optimized at multiple settings.

Thus, the present invention has been described herein with reference to a particular embodiment for a particular application. Those having ordinary skill in the art and access to the present teachings will recognize additional modifications, applications and embodiments within the scope thereof. For example, the illustrative embodiments have been described with reference to circuits and a method for reducing intermodulation distortion in amplifiers and radar receivers. However, the invention is not limited thereto. The linearizer of the present invention may be used in other applications without departing from the scope of the present teachings.

It is therefore intended by the appended claims to cover any and all such applications, modifications and embodiments within the scope of the present invention.

Accordingly,

What is claimed is:

1. A linearizer for reducing intermodulation distortion in a non-linear device, comprising:
   first means for receiving a signal from said device; and
   second means for effecting a gain expansion on said signal;
   wherein said second means is configured to provide an impedance in a signal path of said signal;
   wherein said second means is configured to decrease said impedance when a magnitude of said signal increases;
   wherein said device is configured to effect a gain compression on said signal; and
   wherein said gain expansion matches said gain compression.

2. The linearizer of claim 1 wherein said linearizer is configured to effect substantially linear performance across a system including said device and said linearizer.

3. The linearizer of claim 1 wherein said second means includes a limiter circuitry in shunt with said device.

4. The linearizer of claim 3 wherein said limiter circuitry includes a pair of diodes D1 and D2.

5. The linearizer of claim 4 wherein a first terminal of said diode D1 and a first terminal of said diode D2 are connected together and coupled to a bias voltage.

6. The linearizer of claim 5 wherein a second terminal of said diode D1 is connected to ground.

7. A linearizer for reducing intermodulation distortion in a non-linear device comprising:
   first means for receiving a signal from said device; and
   second means for effecting a gain expansion on said signal;
   wherein said second means includes a limiter circuitry in shunt with said device;
   wherein said limiter circuitry includes a pair of diodes D1 and D2;
   wherein a first terminal of said diode D1 and a first terminal of said diode D2 are connected together and coupled to a bias voltage;
   wherein a second terminal of said diode D1 is connected to ground; and
   wherein a second terminal of said diode D2 is coupled to said signal.

8. The linearizer of claim 7 wherein said second terminal of D2 is also coupled to ground by an inductor L1.

9. The linearizer of claim 8 wherein said second means further includes a second diode pair D3 and D4.

10. The linearizer of claim 9 wherein a first terminal of said diode D3 and a first terminal of said diode D4 are connected together and coupled to said bias voltage.

11. The linearizer of claim 10 wherein a second terminal of said diode D3 is connected to ground.

12. The linearizer of claim 11 wherein a second terminal of said diode D4 is coupled to said signal.

13. A linearizer comprising:
   an input port for receiving a signal; and
   a limiter circuitry in shunt with said signal;
   wherein said limiter circuitry is configured to provide an impedance in a signal path of said signal;
   wherein said limiter circuitry is configured to decrease said impedance when a magnitude of said signal increases;
   wherein said limiter circuitry is configured to effect a gain expansion on said signal; and
   wherein said gain expansion matches a gain compression of a device providing said signal.

14. The linearizer of claim 13 wherein said linearizer is configured to effect substantially linear performance across the linearizer system.

15. The linearizer of claim 13 wherein said limiter circuitry includes a pair of diodes D1 and D2.

16. The linearizer of claim 15 wherein a first terminal of said diode D1 and a first terminal of said diode D2 are connected together and coupled to a bias voltage.

17. The linearizer of claim 16 further comprises a resistor coupled between said bias voltage and said diodes D1 and D2.

18. The linearizer of claim 16 wherein a second terminal of said diode D1 is connected to ground.

19. The linearizer of claim 15 wherein said diodes D1 and D2 are implemented using Schottky diodes.

20. A linearizer comprising:
   an input port for receiving a signal; and
   a limiter circuitry in shunt with said signal;
   wherein said limiter circuitry includes a pair of diodes D1 and D2;
   wherein a first terminal of said diode D1 and a first terminal of said diode D2 are connected together and coupled to a bias voltage;
   wherein a second terminal of said diode D1 is connected to ground; and
   wherein a second terminal of said diode D2 is coupled to said input port.

21. The linearizer of claim 20 further comprises a resistor coupled between said diode D2 and said input port.

22. The linearizer of claim 20 wherein said second terminal of D2 is also coupled to ground by an inductor L1.

23. The linearizer of claim 22 further comprising a second diode pair D3 and D4.

24. The linearizer of claim 22 wherein a first terminal of said diode D3 and a first terminal of said diode D4 are connected together and coupled to said bias voltage.

25. The linearizer of claim 24 further comprising a resistor coupled between said bias voltage and said diodes D3 and D4.

26. The linearizer of claim 24 wherein a second terminal of said diode D3 is connected to ground.

27. The linearizer of claim 26 wherein a second terminal of said diode D4 is coupled to said second terminal of D2 by a resistor.

28. The linearizer of claim 27 further comprising a capacitor C2 coupled between said second terminal of diode D2 and said input port.

29. The linearizer of claim 28 further comprising a resistor in series with a capacitor coupled between said second terminal of diode D2 and said input port.

30. The linearizer of claim 28 further comprising a resistor in series with an inductor L2 coupled between said second terminal of diode D2 and said input port.

31. The linearizer of claim 30 further comprising a capacitor having one end connected to the input port 22 and the other end connected to the inductor L2 and the capacitor C2.

32. The linearizer of claim 26 further comprising a shunt capacitor connected to the common terminals of D3 and D4.

33. The linearizer of claim 23 wherein said diodes D3 and D4 are implemented using Schottky diodes.

* * * * *